United States Patent [19]

Skoutas

[11] Patent Number: 4,679,006
[45] Date of Patent: Jul. 7, 1987

[54] 50% DUTY CYCLE RELAXATION OSCILLATOR WITH LATCH-UP PREVENTION CIRCUIT

[75] Inventor: James P. Skoutas, North Kingstown, R.I.

[73] Assignee: Cherry Semiconductor Corporation, Greenwich, R.I.

[21] Appl. No.: 863,123

[22] Filed: May 14, 1986

[51] Int. Cl.$^4$ ...................... H03K 3/282; H03K 3/295
[52] U.S. Cl. ...................................... 331/111; 331/143
[58] Field of Search ................................. 331/111, 143

[56] References Cited

U.S. PATENT DOCUMENTS 3,742,382  6/1973  Breitzmann et al. ............... 331/111
4,161,703  7/1979  Nutz ..................................... 331/111

Primary Examiner—Siegfried H. Grimm
Attorney, Agent, or Firm—Robert M. Asher

[57] ABSTRACT

An oscillator circuit is disclosed in which a charging path is provided through a charging transistor and a discharging path is provided through a discharging transistor. Both the charging path and discharging path are directed through a first and second terminal for connection across a timing resistor to allow for reliable 50% duty cycle operation. A diode is provided between a voltage limit setting circuit and a second diode. The second diode is connected to the base of a buffer transistor. The buffer transistor turns the discharging transistor on and off. The two diodes provide a delay between the time in which the voltage limit setting circuitry changes the voltage limit and the switching of the discharging transistor to prevent latch-up.

13 Claims, 1 Drawing Figure

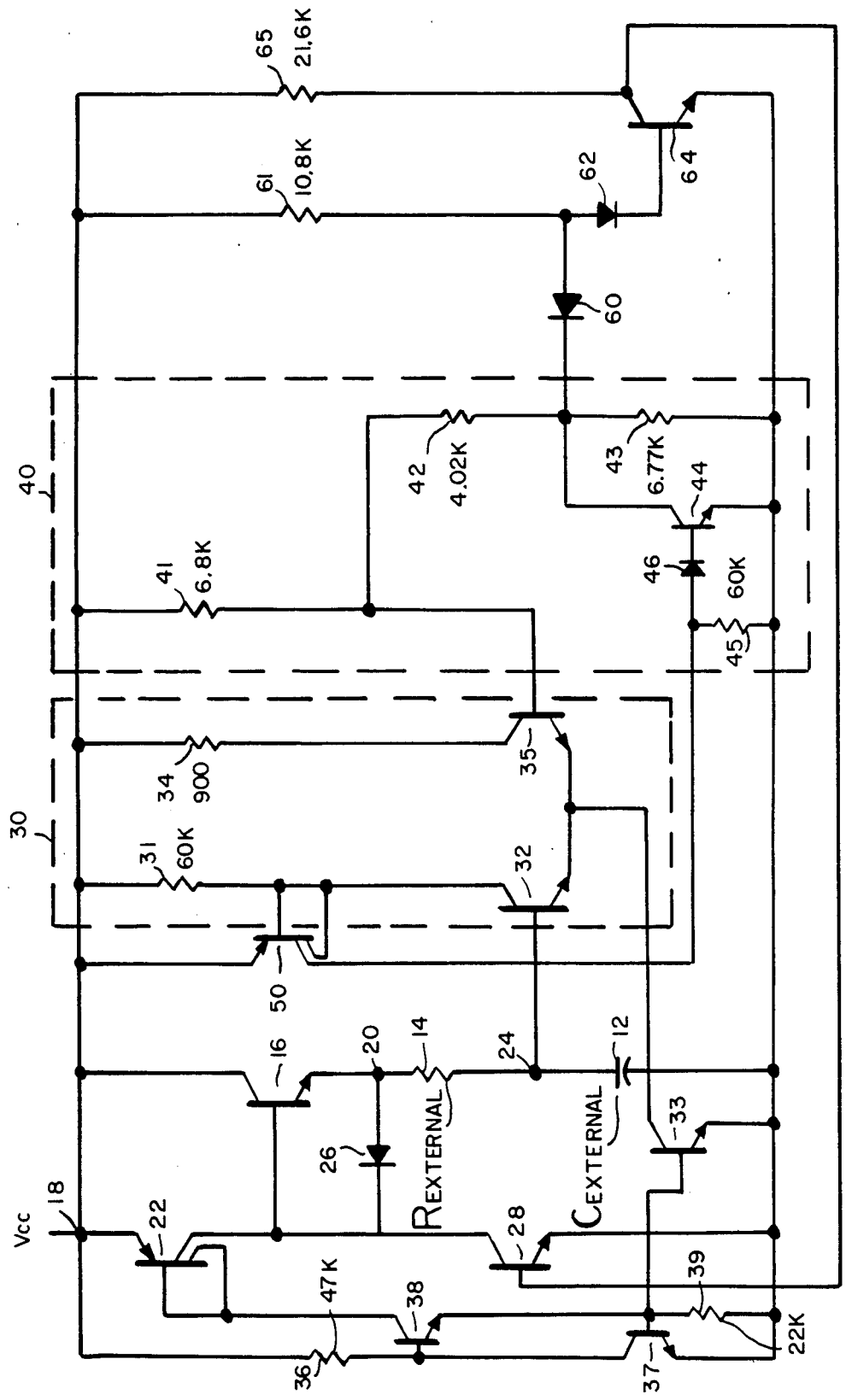

50% DUTY CYCLE RELAXATION OSCILLATOR WITH LATCH-UP PREVENTION CIRCUIT

BACKGROUND OF THE INVENTION

This invention relates to an oscillator circuit which is useful in providing a 50% duty cycle and is designed to prevent latch-up.

Latch-up may occur in an oscillator if the external timing capacitor starts discharging before the voltage limits have been switched. What can occur is, if the timing capacitor is charging and eventually reaches its upper limit it would start to discharge. If it gets below the upper limit before the limit has been changed, then the capacitor will start charging again towards the upper limit. It is therefore necessary to insure that the limits are switched before the direction of the timing capacitor is reversed. Some oscillators incorporate on-board flip-flops to insure a latch free operation. While this method works, it requires more complex circuitry to achieve the desired result. It is an object of the present invention to accomplish a latch-free operation with only two diodes and a transistor to perform the essential task.

Most oscillators use a network of two resistors and one capacitor to set the oscillator timing. While this method is good for achieving variable duty cycles, a considerable error is added into the system when a 50% duty cycle is required. It is an object of the present invention to provide a near ideal 50% duty cycle by charging and discharging the timing capacitor through a single resistor.

SUMMARY OF THE INVENTION

This invention is directed to an oscillator circuit having two terminals between which a single timing resistor may be connected. One of these terminals is for connection to a timing capacitor which is connected at its other end to ground.

The present invention provides a charging transistor connected between a source voltage and the first terminal. The anode of a discharging diode is also connected to the first terminal. The cathode of the discharging diode is connected to a discharging transistor. The second terminal is connected to a comparator which compares the voltage at that terminal with the voltage set by limit setting circuitry. The limit setting circuitry switches between an upper voltage limit and a lower voltage limit. When the voltage at the second terminal meets the limit set by the limit setting circuitry, the limit is switched to the other of the two limits. A diode is connected to the limit setting circuitry such that a buffer transistor is turned on after the circuitry has set an upper voltage limit and is turned off after the limit setting means has set the lower voltage limit. The discharging transistor is switched on and off in response to said buffer transistor.

The circuit of the present invention insures that the voltage limit set by the limit setting circuitry switches before the discharging transistor is switched. Thus, latch-free operation is provided.

A further advantage of the present invention is that both charging and discharging of the timing capacitor take place through a single timing resistor connected between the two terminals. Thus, a reliable 50% duty cycle can be achieved.

Other objects and advantages of the invention will become apparent during the following description of the presently preferred embodiment of the invention taken in conjunction with the drawings.

BRIEF DESCRIPTION OF THE DRAWING

The FIGURE is a schematic diagram of the oscillator circuit of the present invention.

DETAILED DESCRIPTION OF THE PREFERRED EMBODIMENT

Turning now to the drawing, the oscillator circuit of the present invention is shown hooked up to an external timing capacitor 12 and an external timing resistor 14. A charging transistor 16 is connected between a source voltage terminal 18 and a first terminal 20. A current source transistor 22 provides base current to the charging transistor 16. The external timing resistor 14 is connected between the first terminal 20 and a second terminal 24. The timing capacitor 12 connects between the second terminal 24 and ground.

A discharging diode 26 has its anode connected to the first terminal 20. The cathode of the discharging diode 26 is connected to the collector of a discharging transistor 28. The emitter of the discharging transistor 28 is connected to ground. When the discharging transistor 28 is ON, the timing capacitor 12 discharges through discharging diode 26 and discharging transistor 28. Also, it is noted that the collector of discharging transistor 28 is connected to the base of charging transistor 16. Thus, when the discharging transistor 28 is ON, the charging transistor 16 is turned off. When the discharging transistor 28 is OFF, the charging transistor 16 is ON to provide current through the timing resistor 14 thus charging capacitor 12. In accordance with the present invention, both the path of charging current and the path of discharging current pass through resistor 14.

The second terminal 24 is connected to a comparator circuit 30. The comparator circuit 30 includes a resistor 31, a transistor 32, a resistor 34, and transistor 35. Comparator circuitry such as that shown in the figure is well known in the art. The comparator 30 compares the voltage at the second terminal 24 with the voltage set by voltage limit setting circuitry 40. The comparator 30 is biased for proper operation by transistor 33. Biasing of current source transistor 22 and comparator 30 is further provided by resistor 36, transistor 37, transistor 38 and resistor 39.

The voltage limit setting circuitry includes three resistors connected in series—resistor 41, resistor 42 and resistor 43. Resistor 41 is connected to source voltage 18 and resistor 43 is connected to ground. The voltage limit setting circuitry also includes a limit switching transistor 44 which is connected in parallel to ground with resistor 43. A diode 46 is connected to the base of limit switching transistor 44 and a resistor 45 is connected between the anode of diode 46 and ground. The voltage limit setting circuitry provides an upper and a lower voltage limit. When the limit switching transistor 44 is ON, resistors 41 and resistor 42 form a voltage divider to provide a lower limit. The lower limit is approximately determined by the source voltage times the resistance of resistor 42 divided by the sum of the resistances of resistor 41 and resistor 42. When limit switching transistor 44 is OFF, the upper voltage limit is set by the three resistors. The upper voltage limit is approximately equal to the sum of the resistances of resistor 42 and resistor 43 times the source voltage divided by the sum of the resistances of all three resistors in series.

A transistor 50 is provided for switching the limit switching transistor 44 on and off. Transistor 50 is responsive to the comparator 30 such that it will turn on transistor 44 after the comparator 30 indicates that the upper voltage limit has been met. Transistor 50 will turn off transistor 44 when comparator 30 determines that the voltage at second terminal 24 has gone below the limit set by circuitry 40.

In accordance with the present invention, a buffer stage is provided between the transistor 50 and the discharging transistor 28 to avoid latch-up. The buffer stage insures that the voltage limit setting circuitry 40 switches limits before the discharging transistor 28 switches its state. A diode 60 has its cathode connected between resistor 42 and resistor 43. A resistor 61 is connected between the source voltage 18 and the anode of diode 60. A second diode 62 is connected with its anode connected to the anode of diode 60. The cathode of diode 62 connects to the base of a buffer transistor 64. The collector of the buffer transistor 64 is connected to a resistor 65 which connects at its other end to the source voltage 18. The collector of the buffer transistor 64 is also connected to the base of the discharging transistor 28.

When transistor 44 turns ON, diode 60 pulls the voltage at the anode of diode 62 down below 2 $V_{be}$. But the voltage is not pulled down below the 2 $V_{bc}$ threshold until after the base of transistor 35 from the comparator 30 discharges. This turns off the buffer transistor 64 which then turns on discharging transistor 28. When transistor 44 is OFF, buffer transistor 64 is turned on and discharging transistor 28 is then turned off. The important aspect of the design of the circuit of the present invention is that there is a lag in time between the change of the voltage limit set by the limit setting circuitry 40 and the switching of the discharge transistor 28.

Also, an important aspect of the design of the circuit of the present invention is that by using a diode array the diodes must become forward biased before they can conduct current and change the state of the circuit, and these forward bias voltages are very precise and predictable. More specifically, the voltage at the cathode side of diode 60 and hence the base voltage of transistor 35 must change before diode 60 can become forward biased to turn off the buffer transistor 64 to start the discharge cycle.

It is therefore obvious that the limits must switch before the direction of the timing capacitor is reversed.

The resistance values in ohms for the resistors of the presently preferred embodiment are listed in the following table:
Resistor 31—60K
Resistor 34—900
Resistor 36—47K
Resistor 39—22K
Resistor 41—6.8K
Resistor 42—4.02K
Resistor 43—6.77K
Resistor 45—60K
Resistor 61—10.8K
Resistor 65—21.6K The resistance of resistor 43 must be large enough so that the voltage drop across it exceeds 2 $V_{bc}$ when transistor 44 is OFF so that current will not flow through diode 60 to disturb the upper limit value.

The present invention provides a reliable 50% duty cycle by charging and discharging timing capacitor 12 through a single timing resistor 14. A separate charging transistor 16 and discharging transistor 28 are provided in such an arrangement to provide a charging path and discharging path both of which are directed through the first and second terminals. In the operation of the oscillator of the present invention, a timing capacitor 12 is charged through charging transistor 16 and the external timing resistor 14 to an upper base voltage determined by the voltage limit setting circuitry 40. The timing capacitor 12 is discharged through the discharging transistor 28 and the discharging diode 26 through the timing resistor 14 to a low voltage limit set by the voltage limit setting circuitry 40 when limit switching transistor 44 is ON.

50% duty cycle operation is attained in the circuit of the present invention when the voltage across the external resistor 14 at the time the external capacitor 12 reaches the upper voltage limit is equal to the voltage across the external resistor 14 at the time the external capacitor 12 reaches the lower voltage limit. In this manner, the charging and discharging times will be equal. In order to have a reliable determination of the voltage of the external resistor 14 at the two limits it is useful to use the transistor 22 as the component for providing base current to the charging transistor 16. A transistor has a predictable saturation voltage which can be relied upon in the circuit design. It is also presently preferable to match the base-emitter voltage of charging transistor 16 with the threshold voltage of discharging diode 26 and to match the saturation voltage of current source transistor 22 with the saturation voltage of discharging transistor 28.

In order for an oscillator to function without a latch-up condition occuring, the hysteresis must be switched in before the timing capacitor is discharged. When the external capacitor 12 is charged to the upper voltage limit, limit switching transistor 44 turns on and starts the discharge portion of the cycle. The discharging transistor 28 initiates the discharge cycle after the buffer transistor 64 turns off. In order for this to happen, the diode 60 must bring the anode side of diode 62 below the two $V_{bc}$ threshold to turn off buffer transistor 64. But before the voltage at the anode of diode 62 can be brought below its threshold, the base of transistor 35 must discharge first. This provides the delay which enables a latch-free operation.

Of course, it should be understood that various changes and modifications to the preferred embodiment described above will be apparent to those skilled in the art. For example, current source transistor 22 may be replaced by a resistor and the biasing circuitry could be removed replacing transistor 33 with a resistor connected to ground. These and other changes can be made without departing from the spirit and the scope of the invention and without diminishing its attendant advantages. It is therefore intended that such changes and modifications be covered by the following claims.

I claim:

1. An oscillator circuit for charging and discharging a timing capacitor comprising;
   a source voltage terminal;
   a charging transistor having a collector connected to said source voltage terminal and an emitter connected to a first terminal;

discharging diode means having an anode and a cathode, the anode being connected to said first terminal, a discharging transistor having a collector, a base and an emitter, the collector connected to the cathode of said discharging diode means and the emitter of said discharging transistor connected to ground;

limit setting means for setting an upper voltage limit and a lower voltage limit;

comparator means connected between a second terminal and said limit setting means for comparing the voltage at the second terminal with the voltage limit set by said limit setting means, said timing capacitor being connected to said second terminal;

limit switching means for causing said limit setting means to change the limit it has set in response to an indication from said comparator means that the present voltage limit has been reached at said second terminal;

means for switching said discharging transistor on or off; and means for delaying the switching of said discharging transistor in response to a change in the limit set by said limit setting means, such that said discharging transistor switches on or off after said limit setting means has changed the limit.

2. The oscillator circuit of claim 1 further comprising a timing resistor connected between the first terminal and the second terminal.

3. The oscillator circuit of claim 1 wherein said timing capacitor is connected between the second terminal and ground.

4. The oscillator circuit of claim 1 wherein said limit setting means comprises three resistors in series and a limit switching transistor connected in parallel with one of said three resistors, said limit switching transistor having a collector connected to one end of said one of said three resistors, an emitter connected to ground and a base connected to said limit switching means.

5. The oscillator circuit of claim 4 wherein said means for delaying comprises two diodes connected to each other at their respective anode, one diode having a cathode connected to the collector of said limit switching transistor and the other of said diodes having a cathode connected to the base of a buffer transistor, said buffer transistor having a collector connected to the base of said discharging transistor and an emitter connected to ground so that said discharging transistor switches on or off in response to said buffer transistor.

6. The oscillator circuit of claim 5, wherein said comparator means include a transistor whose base is connected to said limit setting means such that when said limit switching transistor turns on, the voltage at said base of said transistor discharges before said buffer transistor switches state.

7. The oscillator circuit of claim 1 further comprising a current source transistor having an emitter connected to said voltage source terminal and a collector connected to the base of said charging transistor.

8. An oscillator circuit comprising:
a source voltage terminal,
a charging transistor having a collector coupled to said source voltage terminal and an emitter connected to a first terminal;
a timing capacitor connected between a second terminal and ground;
a discharging transistor having a collector, a base and an emitter, the collector being coupled to the first terminal and the emitter of said discharging transistor being coupled to ground;

a discharging diode having an anode connected to said first terminal and a cathode connected to the collector of said discharging transistor;

limit setting means for setting an upper voltage limit and a lower voltage limit;

comparator means connected between the second terminal and said limit setting means for comparing the voltage at the second terminal with the voltage limit set by said limit setting means;

limit switching means for causing said limit setting means to change the limit it has set in response to an indication from said comparator means that the present limit has been reached;

means for switching said discharging transistor on or off in response to said limit switching means; and a timing resistor connected between the first terminal and the second terminal, so that the path of discharging current from said timing capacitor and charging current into said timing capacitor pass through said timing resistor.

9. An oscillator circuit comprising:
a source voltage terminal,
a charging transistor having a collector coupled to said source voltage terminal and an emitter connected to a first terminal;
a current source transistor having an emitter connected to said voltage source terminal and a collector connected to the base of said charging transistor;
a timing capacitor connected between a second terminal and ground;
a discharging transistor having a collector, a base and an emitter, the collector being coupled to the first terminal and the emitter of said discharging transistor being coupled to ground;

limit setting means for setting an upper voltage limit and a lower voltage limit;

comparator means connected between the second terminal and said limit setting means for comparing the voltage at the second terminal with the voltage limit set by said limit setting means;

limit switching means for causing said limit setting means to change the limit it has set in response to an indication from said comparator means that the present limit has been reached;

means for switching said discharging transistor on or off in response to said limit switching means; and a timing resistor connected between the first terminal and the second terminal, so that the path of discharging current from said timing capacitor and charging current into said timing capacitor pass through said timing resistor.

10. An oscillator circuit comprising:
a source voltage terminal,
a charging transistor having a collector coupled to said source voltage terminal and an emitter connected to a first terminal;
a timing capacitor connected between a second terminal and ground;
a discharging transistor having a collector, a base and an emitter, the collector being coupled to the first terminal and the emitter of said discharging transistor being coupled to ground;

limit setting means for setting an upper voltage limit and a lower voltage limit, said limit setting means including three resistors connected in series and a limit switching transistor connected in parallel with one of said three resistors, said limit switching transistor having a collector connected to one end of said one of said three resistors, an emitter connected to ground and a base;

comparator means connected between the second terminal and said limit setting means for comparing the voltage at the second terminal with the voltage limit set by said limit setting means;

limit switching means connected to the base of said limit switching transistor for causing said limit setting means to change the limit it has set in response to an indication from said comparator means that the present limit has been reached;

means for switching said discharging transistor on or off in response to said limit switching means; and a timing resistor connected between the first terminal and the second terminal, so that the path of discharging current from said timing capacitor and charging current into said timing capacitor pass through said timing resistor.

11. The oscillator circuit of claim 10 wherein said limit switching means comprises a transistor responsive to said comparator means for causing said limit switching transistor to switch on and off.

12. The oscillator circuit of claim 10 wherein said means for switching said discharging transistor comprises two diodes connected to each other at their respective anode, one diode having a cathode connected to the collector of said limit switching transistor and the other of said diodes having a cathode connected to the base of a buffer transistor, said buffer transistor having a collector connected to the base of said discharging transistor and an emitter connected to ground so that said discharging transistor switches on or off in response to said buffer transistor.

13. The oscillator circuit of claim 12 wherein said comparator means includes a transistor whose base is connected to said limit setting means such that when said limit switching transistor turns on, the voltage at said base of said transistor discharges before said buffer transistor switches state.

* * * * *

UNITED STATES PATENT AND TRADEMARK OFFICE
CERTIFICATE OF CORRECTION

PATENT NO. : 4,679,006

DATED : July 7, 1987

INVENTOR(S) : James P. Skoutas

It is certified that error appears in the above-identified patent and that said Letters Patent is hereby corrected as shown below:

Column 4, line 36:

delete "latoh-up", insert --latch-up--

Column 5, line 51 delete "include", insert --includes--

Signed and Sealed this

Ninth Day of February, 1988

Attest:

DONALD J. QUIGG

Attesting Officer

Commissioner of Patents and Trademarks